(12) United States Patent
Ishizuka

(10) Patent No.: US 10,049,807 B2
(45) Date of Patent: Aug. 14, 2018

(54) LAMINATED COIL COMPONENT AND MATCHING CIRCUIT

(71) Applicant: Murata Manufacturing Co., Ltd., Nagaokakyo-shi, Kyoto-fu (JP)

(72) Inventor: Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/722,010

(22) Filed: Oct. 2, 2017

(65) Prior Publication Data

US 2018/0025829 A1    Jan. 25, 2018

Related U.S. Application Data

(60) Division of application No. 14/841,795, filed on Sep. 1, 2015, now Pat. No. 9,812,245, which is a continuation of application No. PCT/JP2013/084194, filed on Dec. 20, 2013.

(30) Foreign Application Priority Data

Mar. 29, 2013 (JP) ................. 2013-072875

(51) Int. Cl.
| | |
|---|---|
| *H03H 7/01* | (2006.01) |
| *H01F 27/28* | (2006.01) |
| *H01F 17/00* | (2006.01) |
| *H03H 7/38* | (2006.01) |
| *H03H 1/00* | (2006.01) |
| *H03H 7/09* | (2006.01) |

(52) U.S. Cl.
CPC ..... *H01F 27/2804* (2013.01); *H01F 17/0013* (2013.01); *H03H 7/0115* (2013.01); *H03H 7/38* (2013.01); *H01F 2017/0073* (2013.01); *H03H 7/09* (2013.01); *H03H 2001/0085* (2013.01)

(58) Field of Classification Search
CPC ............ H01F 27/2804; H01F 17/0013; H03H 7/0115; H03H 7/38
USPC .......................................... 333/32
See application file for complete search history.

(56) References Cited

U.S. PATENT DOCUMENTS

| | | | |
|---|---|---|---|
| 2008/0197963 A1* | 8/2008 | Muto .................. | H01F 17/0013 336/200 |
| 2014/0077919 A1* | 3/2014 | Godoy .................. | H01F 27/006 336/220 |
| 2015/0065068 A1* | 3/2015 | Mattsson ............ | H01F 17/0006 455/90.2 |

OTHER PUBLICATIONS

Ishizuka, "Laminated Coil Component and Matching Circuit", U.S. Appl. No. 14/841,795, filed Sep. 1, 2015.

* cited by examiner

*Primary Examiner* — Stephen E Jones
*Assistant Examiner* — Scott S Outten
(74) *Attorney, Agent, or Firm* — Keating & Bennett, LLP

(57) ABSTRACT

In a laminated coil component, first coil conductor patterns define a coil opening that generates a magnetic flux in a first direction, second coil conductor patterns define a first coil opening that generates a magnetic flux in the first direction, and a second coil opening that generates a magnetic flux in a second direction. A difference in area between the first coil opening and the second coil opening determines a degree of coupling of the coil defined by the first coil conductor pattern and the coil defined by the second coil conductor pattern. This provides a close proximal arrangement of a plurality of coils proximally while significantly reducing or preventing unnecessary coupling between the coils.

13 Claims, 19 Drawing Sheets

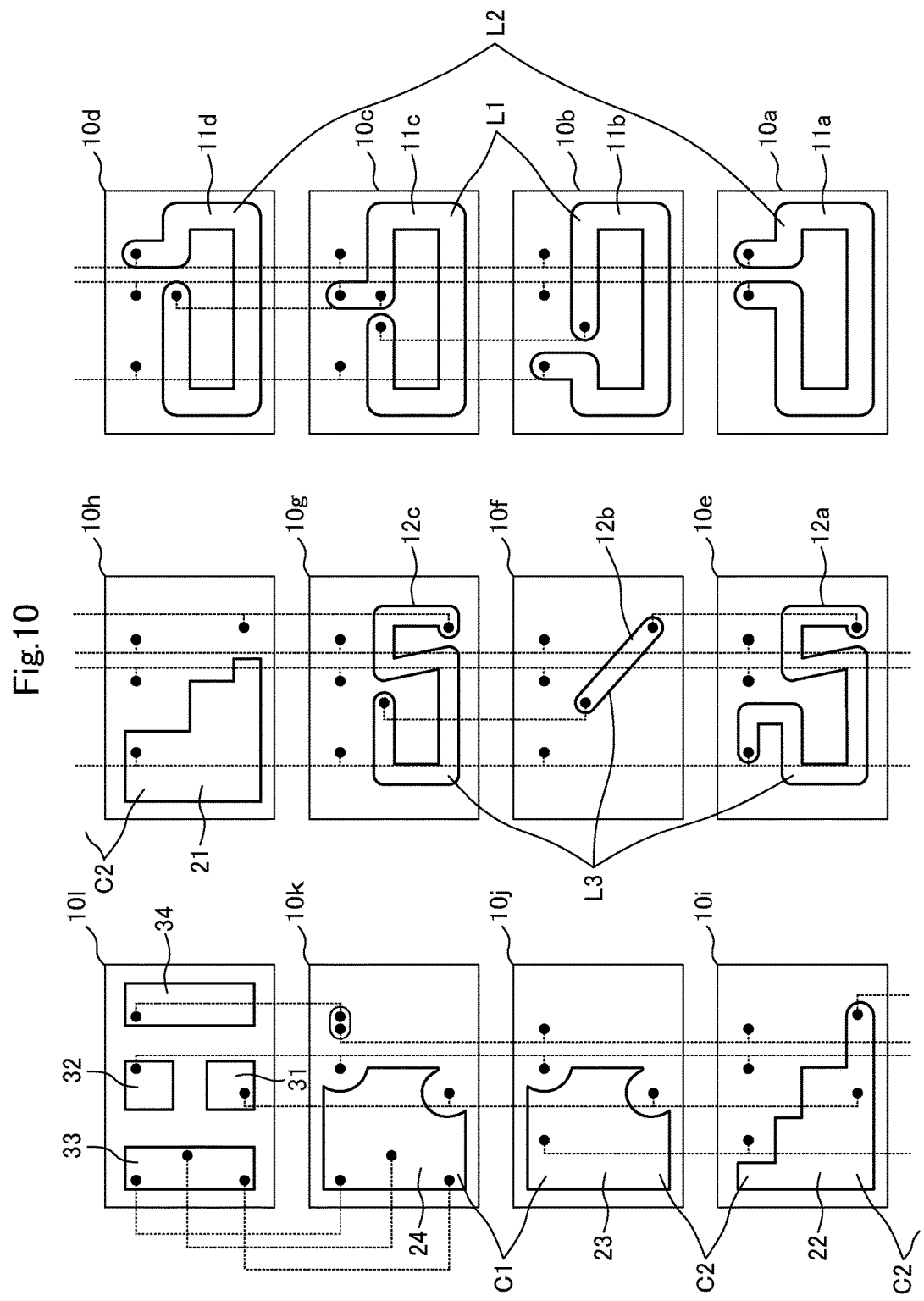

LAMINATED COIL COMPONENT AND MATCHING CIRCUIT

BACKGROUND OF THE INVENTION

1. Field of the Invention

The present invention relates to a laminated coil component including a plurality of insulating layers that are laminated on each other, the insulating layers each including a conductor pattern, and a matching circuit provided with such a laminated coil component.

2. Description of the Related Art

Recently, with the miniaturization and high integration of electronic devices, a plurality of components to be built in or embedded have been required to be mounted in a proximity state in which the components are arranged closer to each other. However, with the mounting in the proximity state, the deterioration of the characteristics due to unnecessary coupling between adjacent components becomes a problem.

In a case in which a plurality of coils (inductors) have to be proximally arranged, some measures such that the open surfaces of the coils are arranged not to face each other are required. Moreover, even in a case in which the open surfaces of the coils are located proximally (in a case of a structure in which the winding axes of the plurality of coils are stacked in the same direction), in order to reduce the unnecessary coupling between the inductors, Japanese Unexamined Patent Application Publication No. 11-016738, for example, has proposed a structure in which a ground conductor layer is inserted between the layers of each coil conductor pattern.

As disclosed in Japanese Unexamined Patent Application Publication No. 11-016738, in the structure in which a ground conductor layer is inserted between the layers of each coil conductor pattern, the coils and the conductor layers are likely to be unnecessarily coupled to each other and the unnecessary coupling deteriorates the Q value of the coils. Therefore, the coil conductor pattern and the ground conductor layer still require a large space between the coil conductor pattern and the ground conductor layer.

SUMMARY OF THE INVENTION

In view of the above, preferred embodiments of the present invention provide a laminated coil component capable of significantly reducing or preventing the unnecessary coupling between a plurality of coils while the coils are proximally arranged, and also a matching circuit provided with such a laminated coil component.

A laminated coil component according to a preferred embodiment of the present invention includes a conductor pattern including a first coil conductor pattern and a second coil conductor pattern, at least one insulating layer on which the conductor pattern is provided, and at least one coil defined by the conductor patterns of the insulating layers that are laminated on each other, and the first coil conductor pattern defines a coil opening that generates a magnetic flux in a first direction; the second coil conductor pattern defines a first coil opening that generates a magnetic flux in the first direction and a second coil opening that generates a magnetic flux in a second direction opposite to the first direction; and the coil opening, in a plan view, overlaps a plurality of the coil openings including the first coil opening and the second coil opening.

With the above configuration, even if a magnetic flux penetrates a coil defined by the first coil conductor pattern and a coil defined by the second coil conductor pattern, both of the coils are in an uncoupled state or in a relatively weak coupled state. Thus, the interlayer distance between the first coil conductor pattern and the second coil conductor pattern is reduced and a plurality of coils are arranged in a limited space.

The outline of the first coil conductor pattern, in a plan view, may preferably overlap the outline of the second coil conductor pattern. This configuration enables both of the first coil conductor pattern and the second coil conductor pattern to define a coil of which the opening has a large diameter, in a limited space. In other words, in order to significantly reduce or prevent coupling, a coil having a small diameter does not need to be defined and thus the configuration makes it possible to configure a coil having necessary inductance with the small number of turns.

In a preferred embodiment of the present invention, in a plan view, the total area of the first coil opening in which the coil opening of the first coil conductor pattern overlaps the first coil opening may be the same or substantially the same as the total area of the second coil opening in which the coil opening of the first coil conductor pattern overlaps the second coil opening. Accordingly, the coil defined by the first coil conductor pattern and the coil defined by the second coil conductor pattern are in a substantially uncoupled state.

In another preferred embodiment of the present invention, in a plan view, the total area of the first coil opening in which the coil opening of the first coil conductor pattern overlaps the first coil opening may be different from the total area of the second coil opening in which the coil opening of the first coil conductor pattern overlaps the second coil opening. Accordingly, the coil defined by the first coil conductor pattern and the coil defined by the second coil conductor pattern are in a predetermined weakly coupled state.

At least one of the first coil conductor pattern and the second coil conductor pattern may preferably be defined over a plurality of the insulating layers. This configuration provides a coil having a large inductance required for a limited occupied area.

One of the first coil conductor pattern and the second coil conductor pattern may define a transformer configured by two coils coupled to each other, for example; and the other of the first coil conductor pattern and the second coil conductor pattern may define an inductor connected to the primary side or the secondary side of the transformer. This configuration provides a coil component including a filter including an inductor, for example; and a transformer impedance conversion circuit.

One of the first coil conductor pattern and the second coil conductor pattern may define a plurality of coils coupled to each other; and the plurality of coils may be outer coil conductor patterns each provided in a position of holding the other of the first coil conductor pattern and the second coil conductor pattern between the plurality of coils in a laminated direction. This configuration, with outer coil conductor patterns, provides inductors that are weakly coupled to each other.

A matching circuit according to a preferred embodiment of the present invention includes the laminated coil component described in the above, a band pass filter including two LC parallel resonant circuits in which the inductors are coupled to each other, and a transformer impedance conversion circuit configured by two inductors coupled to each other, and the inductors of the two LC parallel resonant circuits are defined by the outer coil conductor patterns; and the inductors of the transformer impedance conversion circuit are defined by the coil conductor patterns held between the outer coil conductor patterns.

The above configuration provides a small matching circuit provided with a band pass filter and a transformer impedance conversion circuit.

According to various preferred embodiments of the present invention, while the interlayer distance between the first coil conductor pattern and the second coil conductor pattern is small, the coil defined by the first coil conductor pattern and the coil defined by the second coil conductor pattern is able to be in an uncoupled state or in a relatively weakly coupled state. Thus, the interlayer distance between the first coil conductor pattern and the second coil conductor pattern is significantly reduced and a plurality of coils are arranged in a limited space. Moreover, even if the interlayer distance is small, the degree of coupling of the coil defined by the first coil conductor pattern and the coil defined by the second coil conductor pattern is able to be determined with high accuracy.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 10 is a plan view showing respective insulating layers of the matching circuit 202.

DETAILED DESCRIPTION OF THE PREFERRED EMBODIMENTS

Hereinafter, various preferred embodiments of the present invention will be described with reference to several specific examples. Each of the preferred embodiments is illustrative and other preferred embodiments can be further obtained by configurations shown in different preferred embodiments, the configuration being partially replaced and combined with each other.

First Preferred Embodiment

Figure 1:
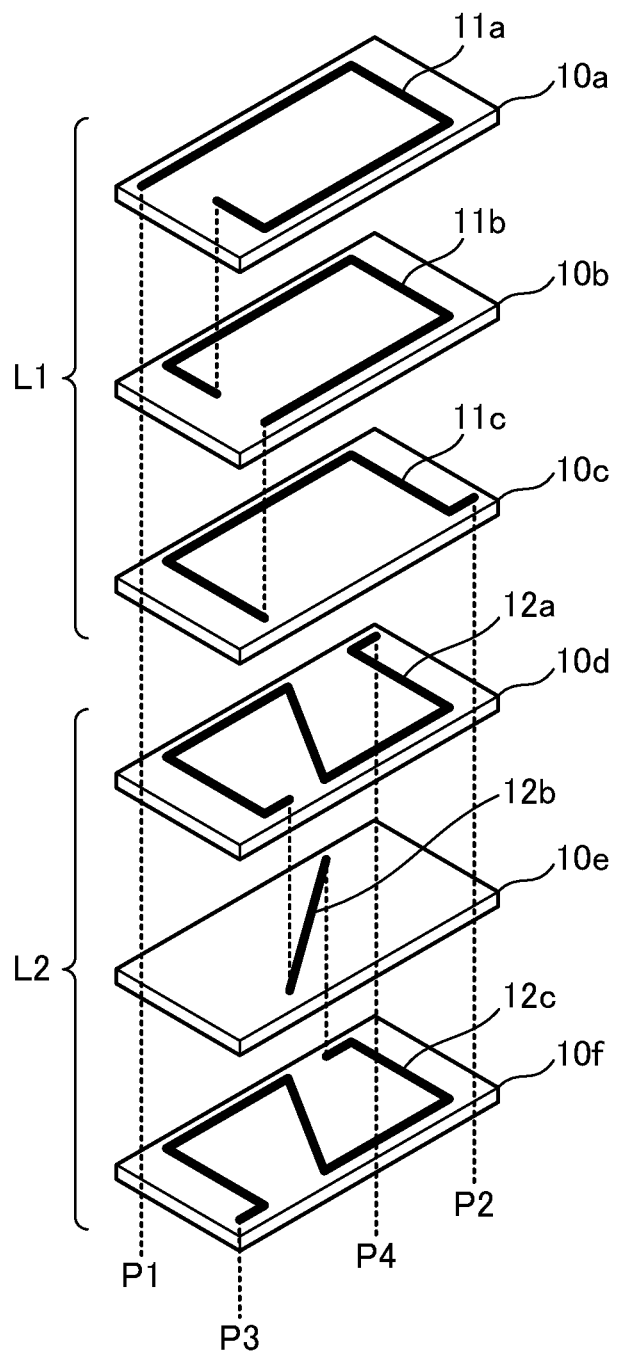
FIG. 1 is an exploded perspective view of a main portion of a laminated coil component 101 according to a first preferred embodiment of the present invention.

FIG. 1 is an exploded perspective view of a main portion of a laminated coil component 101 according to a first preferred embodiment of the present invention.

The laminated coil component 101 includes insulating layers 10a to 10f that are laminated on each other, each of the insulating layers 10a to 10f including at least one conductor pattern; and at least one coil defined by the conductor patterns. The conductor patterns include first coil conductor patterns 11a, 11b, and 11c, and second coil conductor patterns 12a, 12b, and 12c. In other words, the insulating layers 10a, 10b, and 10c include the first coil conductor patterns 11a, 11b, and 11c, respectively, and the insulating layers 10d, 10e, and 10f include the second coil conductor patterns 12a, 12b, and 12c, respectively. The respective conductor patterns are interlayer-connected to each other through via conductors (not shown) at predetermined positions. The laminated coil component includes an external terminal on an end surface or a bottom surface of a laminate, which is not shown in FIG. 1.

The first end of the first coil conductor pattern 11a is connected to a terminal P1. The second end of the first coil conductor pattern 11a is connected to the first end of the first coil conductor pattern 11b, and the second end of the first coil conductor pattern 11b is connected to the first end of the first coil conductor pattern 11c. The second end of the first coil conductor pattern 11c is connected to a terminal P2.

The first end of the second coil conductor pattern 12a is connected to a terminal P4. The second end of the second coil conductor pattern 12a is connected to the first end of the second coil conductor pattern 12b, and the second end of the second coil conductor pattern 12b is connected to the first end of the second coil conductor pattern 12c. The second end of the second coil conductor pattern 12c is connected to a terminal P3.

Figure 2:
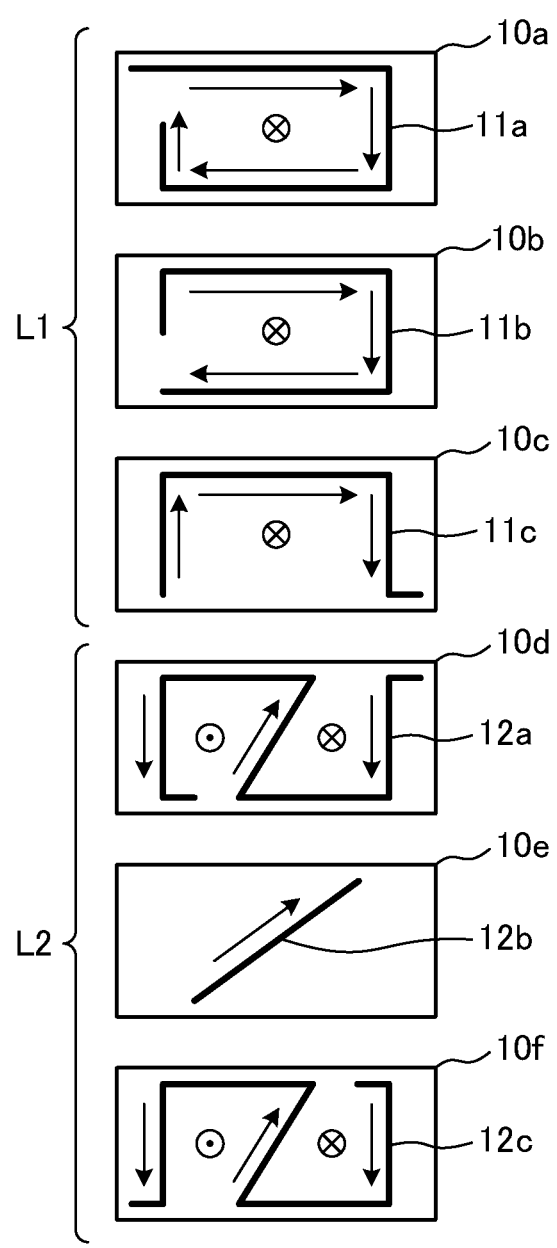
FIG. 2 is a plan view showing respective insulating layers of the laminated coil component 101.
Figure 3A:
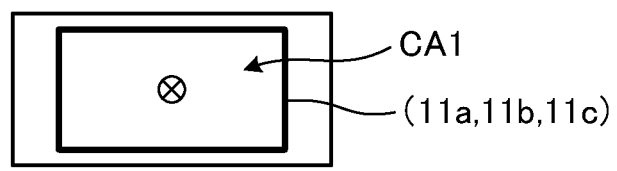
FIG. 3A is a view showing first coil conductor patterns 11a, 11b, and 11c that are overlapped.
Figure 3B:
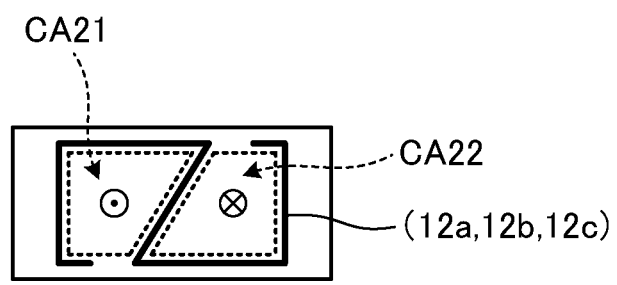
FIG. 3B is a view showing second coil conductor patterns 12a, 12b, and 12c that are overlapped.
Figure 4:
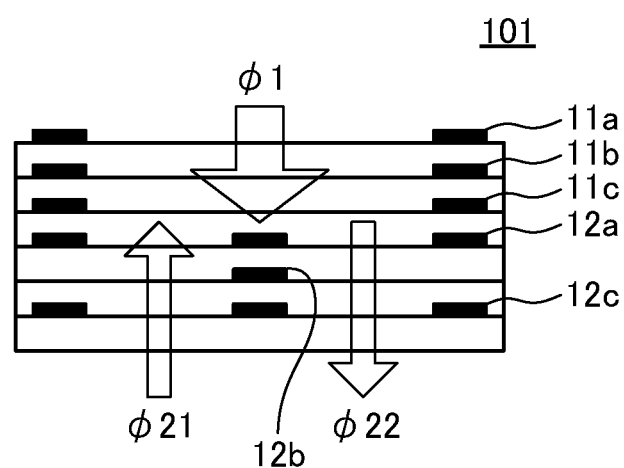
FIG. 4 is a cross sectional view showing the laminated coil component 101.

FIG. 2 is a plan view showing the respective insulating layers of the laminated coil component 101. FIG. 2 shows an example of the direction of an electric current flowing in each of the coil conductor patterns and the direction of a magnetic flux passing through a coil opening. FIG. 3A is a view showing first coil conductor patterns 11a, 11b, and 11c that are overlapped, and FIG. 3B is a view showing second coil conductor patterns 12a, 12b, and 12c that are overlapped. FIG. 4 is a cross sectional view showing the laminated coil component 101.

As shown by the arrows in FIG. 2, an electric current flows in each of the coil conductor patterns, which generates magnetic fluxes in directions as shown by a cross mark and a dot mark in FIG. 2. In this way, the direction of the electric current is shown by an arrow and the direction of a magnetic flux is shown by a cross mark and a dot mark, which is also applied to the other figures to be shown below.

As shown in FIG. 3A and FIG. 3B, the first coil conductor patterns 11a, 11b, and 11c define a coil opening CA1 that generates a magnetic flux in a first direction (depth direction of the paper surface, for example). The second coil conductor patterns 12a, 12b, and 12c define a first coil opening CA21 that generates a magnetic flux in the first direction (depth direction of the paper surface), and a second coil opening CA22 that generates a magnetic flux in a second direction (front direction of the paper surface). The area of the first coil opening CA21 is equal or substantially equal to the area of the second coil opening CA22.

The coil opening CA1 of the first coil conductor patterns 11a, 11b, and 11c, in a plan view, overlap the first coil opening CA21 and the second coil opening CA22 of the second coil conductor patterns 12a, 12b, and 12c.

As shown in FIG. 4, the first coil conductor patterns 11a, 11b, and 11c generate a magnetic flux φ1 in the first direction and the second coil conductor patterns 12a, 12b, and 12c generate a magnetic flux φ21 in the first direction and a magnetic flux φ22 in the second direction, respectively.

By the above configuration, the magnetic flux φ22 passing through the coil opening CA22 defined by the second coil conductor patterns 12a, 12b, and 12c acts in a direction in which the magnetic flux φ22 and the magnetic flux φ1 passing through the coil opening CA1 defined by the first coil conductor patterns 11a, 11b, and 11c strengthen each other (the inductance is increased); and the magnetic flux φ21 passing through the coil opening CA21 acts in a direction in which the magnetic flux φ21 and the magnetic flux φ1 passing through the coil opening CA1 weaken each other (the inductance is decreased).

Figure 5:
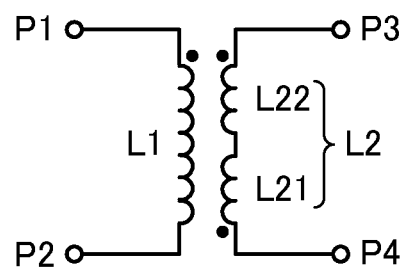
FIG. 5 is a circuit diagram of the laminated coil component 101.

FIG. 5 is a circuit diagram of the laminated coil component 101. A first inductor L1 is connected between terminals P1 and P2, and a second inductor L2 is connected between terminals P3 and P4. The second inductor L2 is defined by inductors L21 and L22 that are connected in series to each other. In the present preferred embodiment of the present invention, the inductor L1 is an inductor defined by the first coil conductor patterns 11a, 11b, and 11c; and the inductor L2 is an inductor defined by the second coil conductor patterns 12a, 12b, and 12c. The inductors L21 and L22 are defined, respectively, by a portion in which the second coil conductor patterns 12a, 12b, and 12c define the coil openings CA21 and CA22. In this way, the inductor L1 and the inductor L22 are coupled with the same polarity and the inductor L1 and the inductor L21 are coupled with the reverse polarity.

In other words, even when the coil opening CA1 defined by the first coil conductor patterns 11a, 11b, and 11c and the coil openings CA21 and CA22 defined by the second coil conductor patterns 12a, 12b, and 12c are passed through by a magnetic flux, both of the coils are equivalently uncoupled to each other. Therefore, even when the interlayer distance between the first coil conductor patterns 11a, 11b, and 11c and the second coil conductor patterns 12a, 12b, and 12c is reduced, the unnecessary coupling does not occur, so that two coils are able to be arranged in a limited space.

Second Preferred Embodiment

Figure 6:
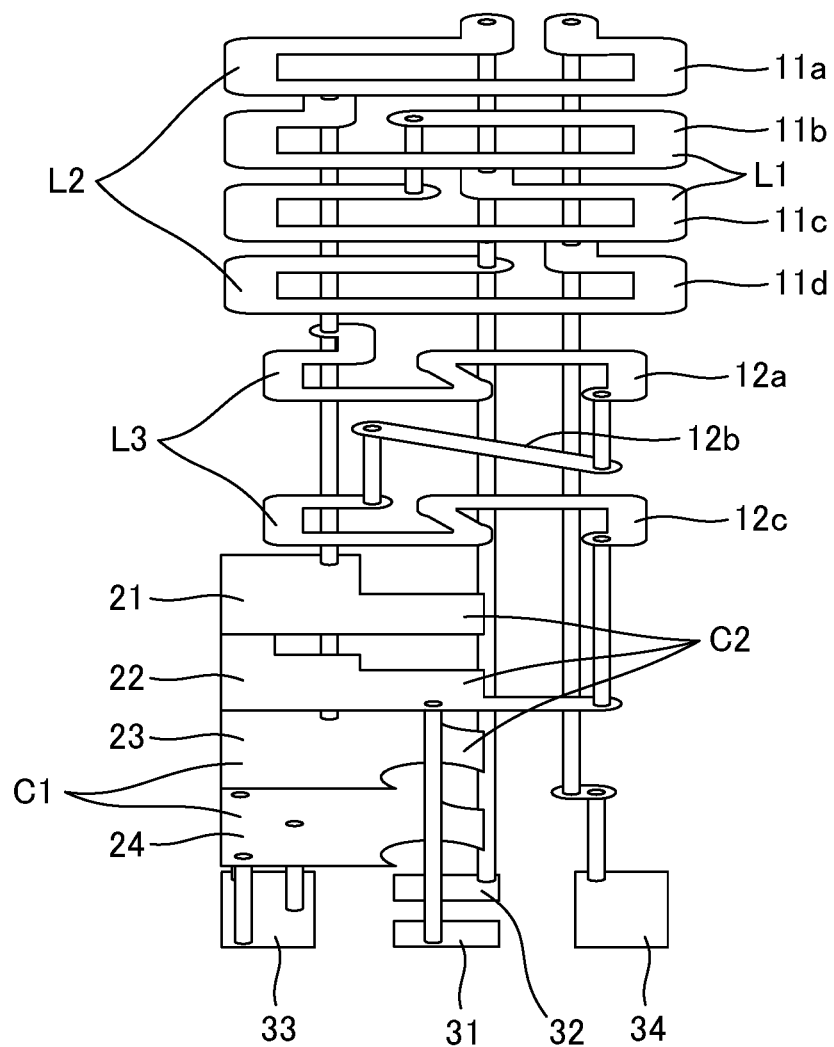
FIG. 6 is an exploded perspective view of a main portion of a matching circuit 201 according to a second preferred embodiment of the present invention.
Figure 7:
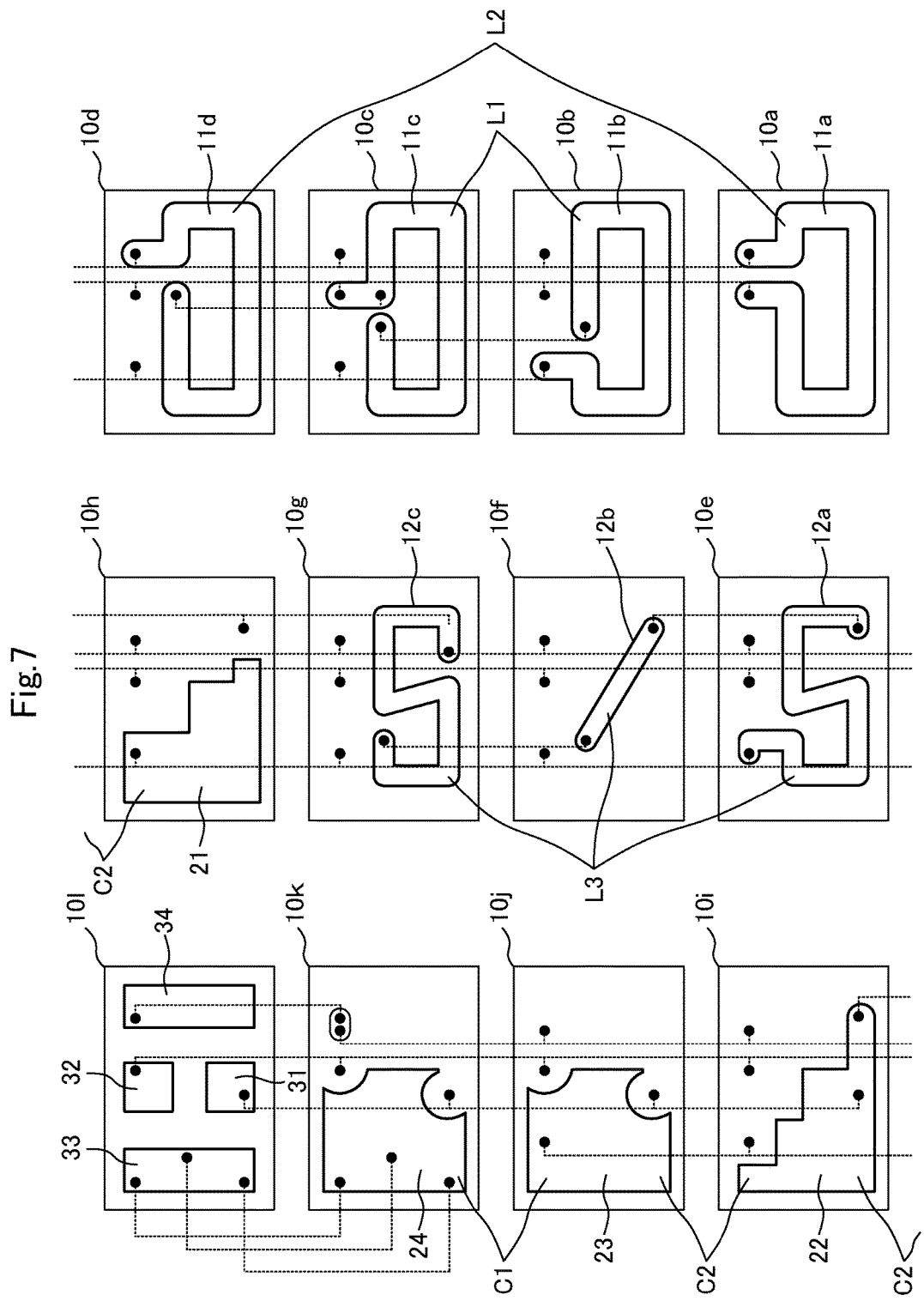
FIG. 7 is a plan view showing respective insulating layers of the matching circuit 201.

FIG. 6 is an exploded perspective view of a main portion of a matching circuit 201 according to a second preferred embodiment of the present invention. FIG. 7 is a plan view showing the respective insulating layers of the matching circuit 201.

The matching circuit 201 includes insulating layers 10a to 10l that are laminated on each other, each of the insulating layers 10a to 10l including at least one conductor pattern; and at least one coil defined by the conductor patterns. The conductor patterns include first coil conductor patterns 11a to 11d, and second coil conductor patterns 12a to 12c. The respective conductor patterns are interlayer-connected to each other through via conductors (not shown) at predetermined positions. The insulating layers 10a to 10d include first coil conductor patterns 11a to 11d. The insulating layers 10e to 10g include second coil conductor patterns 12a to 12c. The insulating layers 10h to 10j include capacitor electrodes 21 to 23. The insulating layer 10k includes a ground electrode 24. The lowermost insulating layer 10l includes input/output terminals 31 and 32 and ground terminals 33 and 34.

Figure 8:
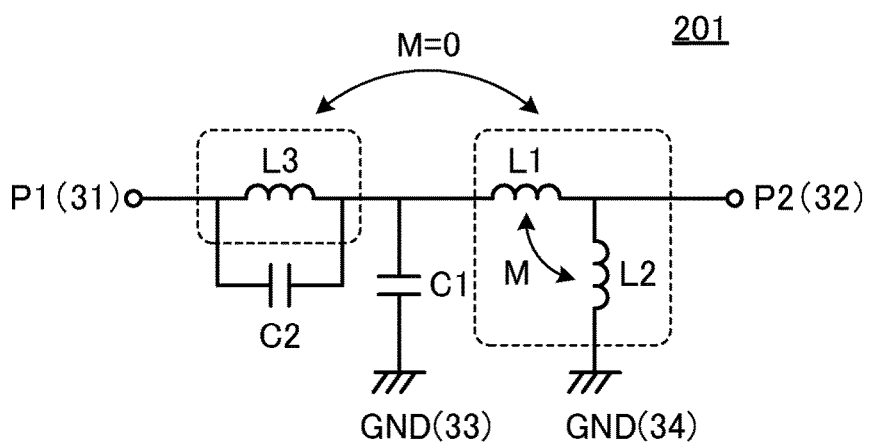
FIG. 8 is a circuit diagram of the matching circuit 201.

FIG. 8 is a circuit diagram of the matching circuit 201. The coil conductor patterns 11b and 11c define an inductor L1, and the coil conductor patterns 11a and 11d define an inductor L2. The coil conductor patterns 12a, 12b, and 12c define an inductor L3. The capacitor electrode 23 and the ground electrode 24 define a capacitor C1, and the capacitor electrodes 21, 22, and 23 define a capacitor C2.

In FIG. 8, the inductor L1 and the inductor L2 define an impedance conversion circuit having an auto transformer (single winding transformer) structure. The inductors L1 and L2 are coupled to each other through a mutual inductance M. In the present preferred embodiment of the present invention, the inductance of the inductors L1 and L2 is indicated by L1 and L2 and the mutual inductance is indicated by M, the impedance conversion circuit is transformed into a T-type equivalent circuit configured by the inductors of (L1+M), (L2+M), and (−M) from the left in order. Accordingly, the impedance conversion ratio of the transformer is {(L1+M)+(L2+M)}:{(L2+M)+(−M)}=(L1+L2+2M):L2.

In FIG. 8, the capacitors C1 and C2 and the inductor L3 define and function as a band elimination filter that significantly reduces or prevents an unnecessary frequency band. Since the inductor L3 of the filter and the inductors L1 and L2 of the above described transformer for impedance conversion are not coupled substantially, the filter and the transformer act independently without interfering with each other.

Third Preferred Embodiment

Figure 9:
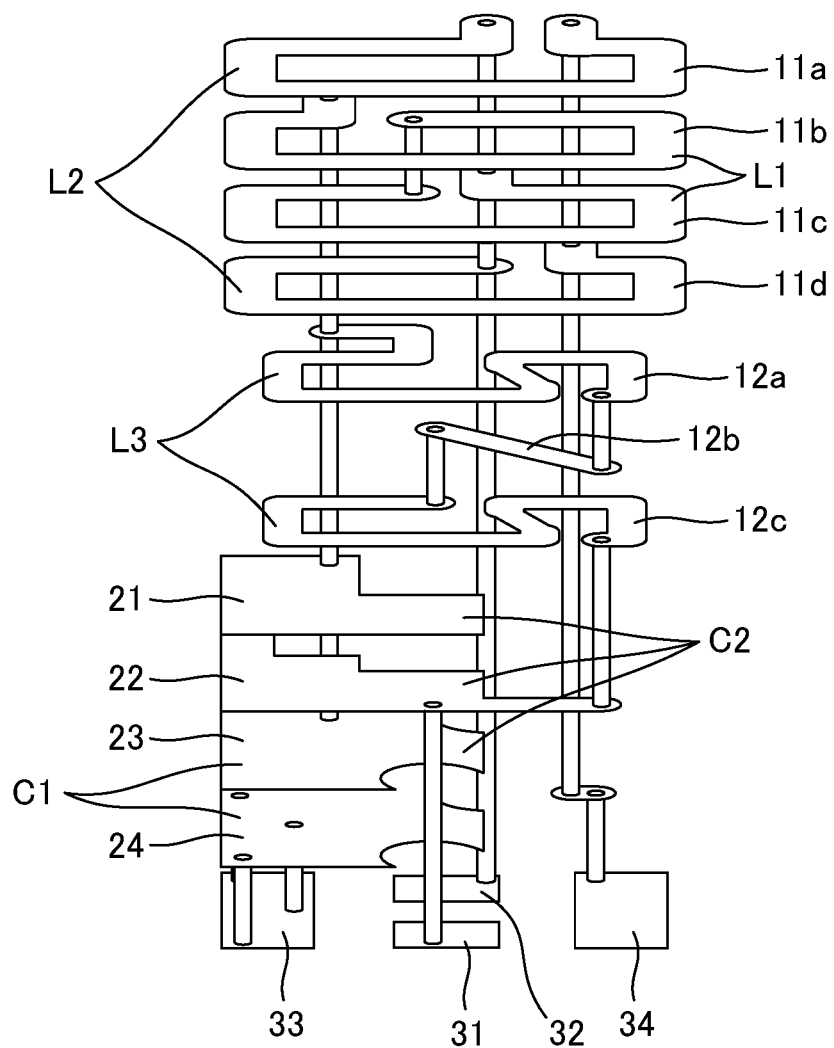
FIG. 9 is an exploded perspective view of a main portion of a matching circuit 202 according to a third preferred embodiment of the present invention.
Figure 11A:
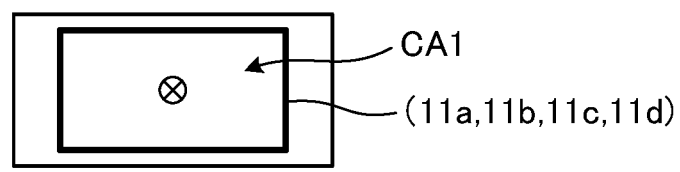
FIG. 11A is a view showing first coil conductor patterns 11a, 11b, and 11c of the matching circuit 202 that are overlapped.
Figure 11B:
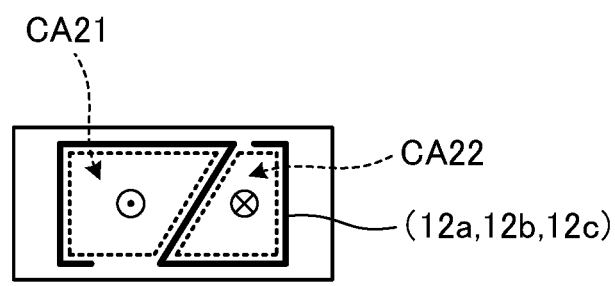
FIG. 11B is a view showing second coil conductor patterns 12a, 12b, and 12c of the matching circuit 202 that are overlapped.
Figure 12:
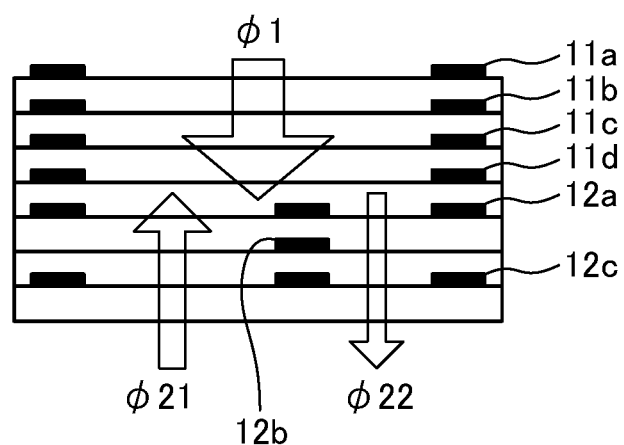
FIG. 12 is a cross sectional view of a portion of layers including a coil conductor pattern of the matching circuit 202.

FIG. 9 is an exploded perspective view of a main portion of a matching circuit 202 according to a third preferred embodiment of the present invention. FIG. 10 is a plan view showing the respective insulating layers of the matching circuit 202. FIG. 11A is a view showing first coil conductor patterns 11a, 11b, 11c, and 11d of the matching circuit 202 that are overlapped, and FIG. 11B is a view showing second coil conductor patterns 12a, 12b, and 12c of the matching circuit 202 that are overlapped. FIG. 12 is a cross sectional view of a portion of layers including a coil conductor pattern of the matching circuit 202. Furthermore, FIG. 13 is a circuit diagram of the matching circuit 202.

The matching circuit 202 differs from the matching circuit 201 according to the second preferred embodiment of the present invention in that the second coil conductor patterns 12a, 12b, and 12c have different shapes. As shown in FIG. 9 and FIG. 10, a shape defined by the second coil conductor patterns 12a, 12b, and 12c is point asymmetric. As shown in FIG. 11, the first coil conductor patterns 11a, 11b, 11c, and 11d define a coil opening CA1 that generates a magnetic flux in a first direction (depth direction of the paper surface, for example). The second coil conductor patterns 12a, 12b, and 12c define a first coil opening CA21 that generates a magnetic flux in the first direction (depth direction of the paper surface), and a second coil opening CA22 that generates a magnetic flux in a second direction (front direction of the paper surface). Since a shape defined by the second coil conductor patterns 12a, 12b, and 12c is point asymmetric, the area of the first coil opening CA21 is different from the area of the second coil opening CA22. The coil opening CA1 of the first coil conductor patterns 11a, 11b, 11c, and 11d in a plan view, overlap the first coil opening CA21 and the second coil opening CA22 of the second coil conductor patterns 12a, 12b, and 12c.

As shown in FIG. 12, the first coil conductor patterns 11a, 11b, 11c, and 11d generate a magnetic flux $\varphi1$ in the first direction and the second coil conductor patterns 12a, 12b, and 12c generate a magnetic flux $\varphi21$ in the first direction and a magnetic flux $\varphi22$ in the second direction, respectively. By the above configuration, the magnetic flux $\varphi22$ passing through the coil opening CA22 defined by the second coil conductor patterns 12a, 12b, and 12c acts in a direction in which the magnetic flux $\varphi22$ and the magnetic flux $\varphi1$ passing through the coil opening CA1 defined by the first coil conductor patterns 11a, 11b, 11c, and 11d strengthen each other (the inductance is increased); and the magnetic flux $\varphi21$ passing through the coil opening CA21 acts in a direction in which the magnetic flux $\varphi21$ and the magnetic flux $\varphi1$ passing through the coil opening CA1 weaken each other (the inductance is decreased). In the present preferred embodiment of the present invention, since the coil opening CA21 through which the magnetic flux $\varphi21$ passes is larger than the coil opening CA22 through which the magnetic flux $\varphi22$ passes, the coils (L1 and L2) defined by the first coil conductor patterns 11a, 11b, 11c, and 11d are coupled to the coil (L3) defined by the second coil conductor patterns 12a, 12b, and 12c by a difference in intensity of the magnetic fluxes $\varphi21$ and $\varphi22$. More accurately, mainly, with the ratio of a difference in area of the coil openings CA21 and CA22 and the area of the coil opening CA1, the coupling coefficient of the coil (L1 and L2) defined by the first coil conductor patterns 11a, 11b, 11c, and 11d and the coil (L3) defined by the second coil conductor patterns 12a, 12b, and 12c is determined.

Figure 13:
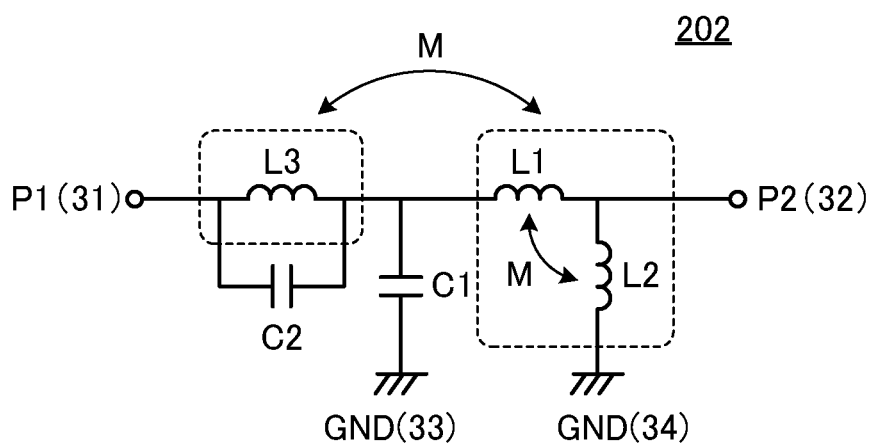
FIG. 13 is a circuit diagram of the matching circuit 202.

In the matching circuit 202 shown in FIG. 13, the impedance conversion is performed by the transformer ratio of the transformer defined by the inductors L1 and L2. In addition, the band elimination filter including the inductor L3 eliminates a secondary or tertiary harmonic component of a use frequency band. However, compared with a case of a single transformer by connecting the inductor L3 to the inductor L1 of the transformer by the inductors L1 and L2 in series, a deviation in the transformer ratio of the transformer is generated. According to the third preferred embodiment of the present invention, the inductor L3 is weakly coupled to the inductors (L1 and L2), which corrects the transformer ratio of the transformer by the inductors L1 and L2.

Accordingly, even when the interlayer distance of the first coil conductor patterns 11a to 11d and the second coil conductor patterns 12a to 12c is reduced, desired weak coupling occurs, so that a matching circuit including a plurality of coils is able to be provided in a limited space. In addition, even when the interlayer distance is small, the degree of coupling between the inductor L3 and the inductors (L1 and L2) is able to be determined with high accuracy.

Fourth Preferred Embodiment

Figure 14:
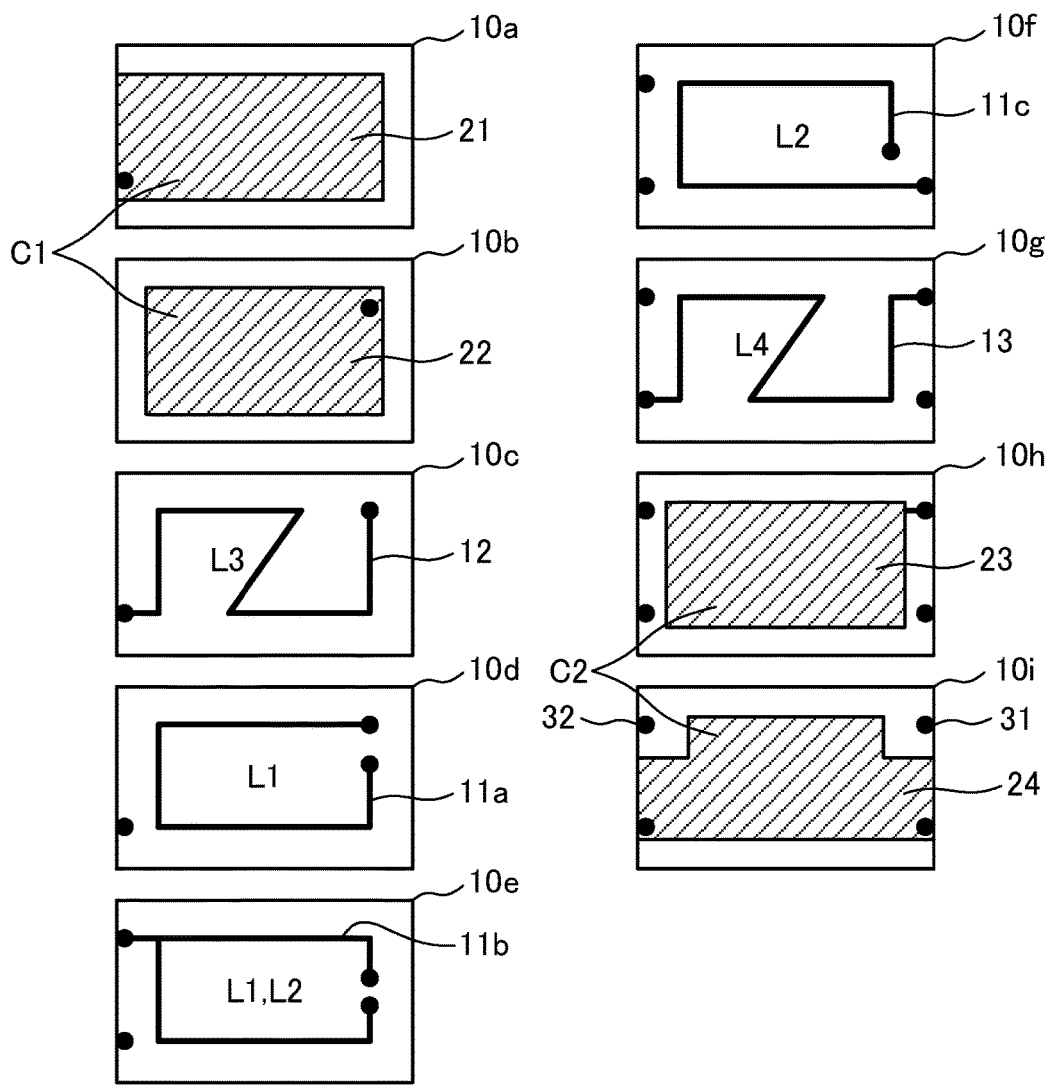
FIG. 14 is a plan view showing respective insulating layers of a matching circuit 203 according to a fourth preferred embodiment of the present invention.

FIG. 14 is a plan view showing the respective insulating layers of a matching circuit 203 according to a fourth preferred embodiment of the present invention. In the matching circuit 203, the insulating layers 10d, 10e, and 10f include the first coil conductor patterns 11a, 11b, and 11c, and the insulating layers 10c and 10g include the second coil conductor patterns 12 and 13. In addition, the insulating layers 10a and 10b include the capacitor electrodes 21 and 22, and the insulating layers 10h and 10i include the capacitor electrode 23 and the ground electrode 24, respectively.

The first end of the first coil conductor pattern 11a is connected to the capacitor electrode 22, and the second end of the first coil conductor pattern 11a is connected to the first end of the first coil conductor pattern 11b. The second end of the first coil conductor pattern 11b is connected to the first end of the first coil conductor pattern 11c. The second end of the first coil conductor pattern 11c is connected to the ground electrode 24. The first end of the second coil conductor pattern 12 is connected to the capacitor electrode 22, and the first end of the second coil conductor pattern 13 is connected to the capacitor electrode 23. Moreover, the first ends of the second coil conductor patterns 12 and 13 are connected to the ground electrode 24, respectively.

Figure 15:
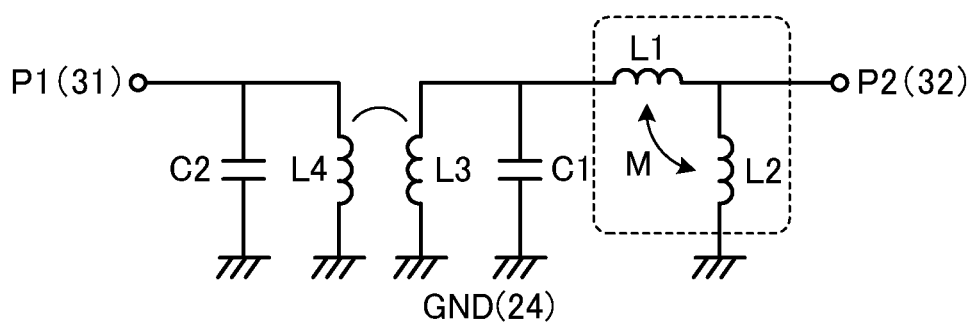
FIG. 15 is a circuit diagram of the matching circuit 203.

FIG. 15 is a circuit diagram of the matching circuit 203. The coil conductor patterns 11a and 11b define an inductor L1, and the coil conductor patterns 11b and 11c define an inductor L2. The coil conductor pattern 12 defines an inductor L3, and the coil conductor pattern 13 defines an inductor L4. The capacitor electrodes 21 and 22 define a capacitor C1, and the capacitor electrode 23 and the ground electrode 24 define a capacitor C2.

In FIG. 15, the inductor L1 and the inductor L2 define an impedance conversion circuit having an auto transformer (single winding transformer) structure. The parallel resonant circuit defined by the capacitor C2 and the inductor L4 and the parallel resonant circuit defined by the capacitor C1 and the inductor L3 are coupled to each other by transformer coupling of the inductor L3 and the inductor L4. The capacitors C1 and C2 and the inductors L3 and L4 define a band pass filter.

The first coil conductor patterns 11a, 11b, and 11c define a coil opening that generates a magnetic flux in a first direction, and the second coil conductor patterns 12 and 13 define a first coil opening that generates a magnetic flux in the first direction and a second coil opening that generates a magnetic flux in a second direction. Then, the coil opening of the first coil conductor pattern, in a plan view, overlaps a plurality of the coil openings including the first coil opening and the second coil opening of the second coil conductor pattern. These relationships preferably are the same or substantially the same as the relationships shown in the first to third preferred embodiments of the present invention. Thus, the inductors (L3 and L4) of the filter and the inductors (L1 and L2) of the transformer for impedance conversion are not coupled substantially and the filter and the transformer act independently without interfering with each other.

According to this fourth preferred embodiment of the present invention, the second coil conductor patterns 12 and 13 are not connected and are separated from each other in terms of direct current. In addition, the second coil conductor patterns 12 and 13 are arranged so as to hold the first coil conductor pattern between the second coil conductor patterns 12 and 13 in a laminated direction.

According to this configuration, in spite of the fact that the first coil conductor and the second coil conductor are adjacent to each other in the laminated direction, the inductors (L1 and L2) defined by the first coil conductor and the inductors (L3 and L4) defined by the second coil conductor are hardly coupled at all and furthermore the inductors L3 and L4 defined by the second coil conductor patterns 12 and 13 of which the layers are separated are coupled to each other.

In addition, since the layer interval between the second coil conductor patterns 12 and 13 is comparatively large, the coupling coefficient between the inductors L3 and L4 is able to be made smaller. Accordingly, the pass band width of the band pass filter is able to be set to a desired small band.

Fifth Preferred Embodiment

In a fifth preferred embodiment of the present invention, several examples of the first coil conductor pattern and the second coil conductor pattern are shown with reference to FIG. 16A, FIG. 16B, FIG. 16C, FIG. 17A, FIG. 17B, FIG. 18A, FIG. 18B, and FIG. 19. In any of the examples, the first coil conductor pattern 11 defines a coil opening that generates a magnetic flux in a first direction, and the second coil conductor pattern 12 defines a first coil opening that generates a magnetic flux in the first direction and a second coil opening that generates a magnetic flux in a second direction.

Figure 16A:
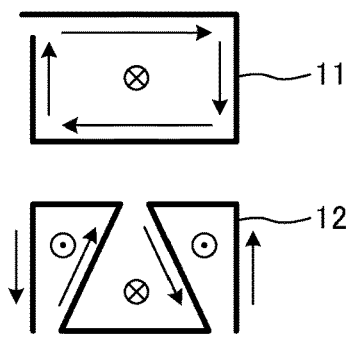
FIG. 16A, FIG. 16B, and FIG. 16C are plan views of a first coil conductor pattern and a second coil conductor pattern of a laminated coil component according to a fifth preferred embodiment of the present invention.
Figure 16B:
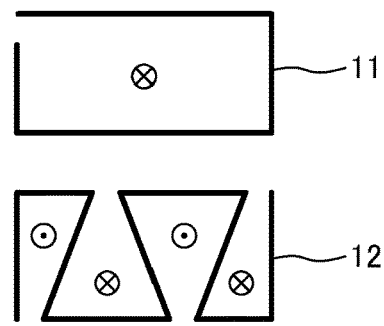
Figure 16C:
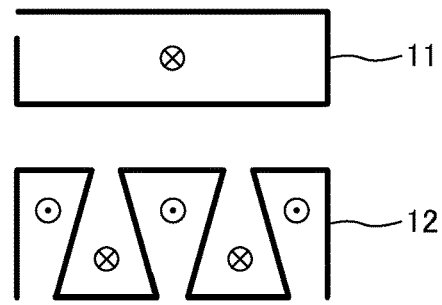

In the example of FIG. 16A, the second coil conductor pattern 12 defines a first coil opening that generates a magnetic flux in the first direction, and two second coil openings that generate magnetic fluxes in the second direction. In the example of FIG. 16B, the second coil conductor pattern 12 defines two first coil openings that generate magnetic fluxes in the first direction, and two second coil openings that generate magnetic fluxes in the second direction. In the example of FIG. 16C, the second coil conductor pattern 12 defines two first coil openings that generate magnetic fluxes in the first direction, and three second coil openings that generate magnetic fluxes in the second direction. As shown in the examples, the second coil conductor pattern may be provided so as to define three or more coil openings.

Figure 17A:
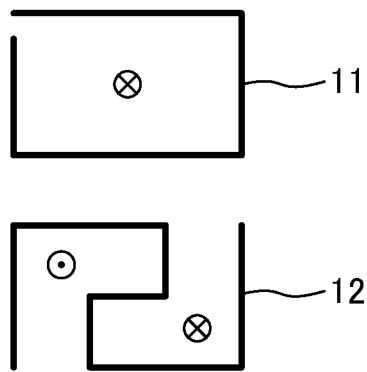
FIG. 17A and FIG. 17B are plan views of the first coil conductor pattern and the second coil conductor pattern of the laminated coil component according to the fifth preferred embodiment of the present invention.
Figure 17B:
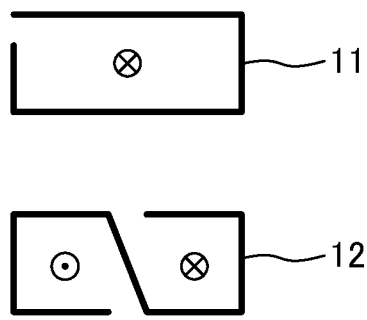

In the examples of FIG. 17A and FIG. 17B, the second coil conductor pattern 12 defines a first coil opening that generates a magnetic flux in the first direction, and the two second coil openings that generate magnetic fluxes in a second direction. The shape of the coil opening defined by the second coil conductor pattern is not limited to a triangle or a trapezoidal shape and, as shown in the example of FIG. 17A, the two coil openings defined by the second coil conductor pattern may have a rectangular double spiral shape. Alternatively, as shown in the example of FIG. 17B, the ends as a starting point and an ending point may be in positions near the center of the region in which the patterns are provided.

Figure 18A:
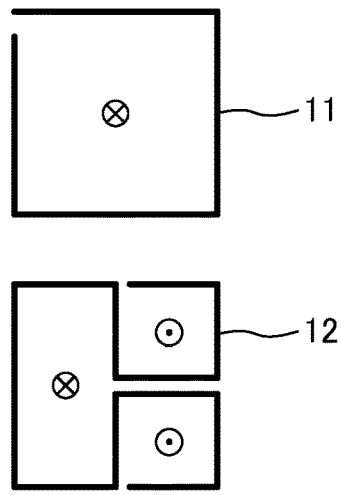
FIG. 18A and FIG. 18B are plan views of the first coil conductor pattern and the second coil conductor pattern of the laminated coil component according to the fifth preferred embodiment of the present invention.
Figure 18B:
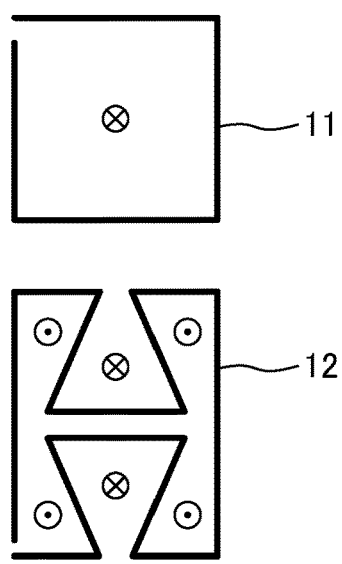

In the examples of FIG. 18A and FIG. 18B, the second coil conductor pattern 12 defines a first coil opening that generates a magnetic flux in the first direction, and the second coil openings that generate magnetic fluxes in the second direction. In this example, the first coil opening and the second coil openings are arranged in a matrix in a plane.

Figure 19:
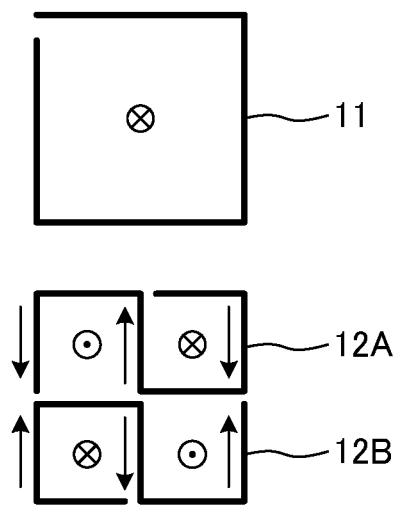
FIG. 19 a plan view of the first coil conductor pattern and the second coil conductor pattern of the laminated coil component according to the fifth preferred embodiment of the present invention.

In the example of FIG. 19, two second coil conductor patterns 12A and 12B are provided. The second coil conductor patterns 12A and 12B define a first coil opening that generates a magnetic flux in the first direction, and two second coil openings that generate magnetic fluxes in the second direction. Therefore, the second coil conductor pattern 12A and the first coil conductor pattern 11 are not substantially coupled to each other and the second coil conductor pattern 12B and the first coil conductor pattern 11 are not substantially coupled to each other.

OTHER PREFERRED EMBODIMENTS

While the foregoing preferred embodiments show examples in which, in a plan view, the coil opening of the first coil conductor pattern preferably entirely overlaps the first coil opening and the second coil opening of the second coil conductor pattern, the coil opening of the first coil conductor pattern, in a plan view, may not entirely overlap the first coil opening and the second coil opening of the second coil conductor pattern and may overlap a plurality of coil openings including the first coil opening and the second coil opening of the second coil conductor pattern.

In addition, the first coil conductor pattern may not be limited to a pattern defining a single coil opening and may define a plurality of coil openings. In such a case, all coil openings or one coil opening of the first coil conductor pattern may entirely overlap the first coil opening and the second coil opening of the second coil conductor pattern.

Finally, the above described preferred embodiments are to be considered in all respects as illustrative and not restrictive. The scope of the present invention is defined by the following claims, not by the foregoing preferred embodiments. Further, the scope of the present invention is intended to include the scopes of the claims and all possible changes and modifications within the senses and scopes of equivalents.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A laminated coil component comprising:
   a conductor pattern including a first coil conductor pattern and a second coil conductor pattern;
   a plurality of insulating layers including at least one insulating layer on which the conductor pattern is provided, the plurality of insulating layers laminated on each other; and
   at least one coil defined by the conductor pattern; wherein
   the first coil conductor pattern defines a coil opening that generates a magnetic flux in a first direction;
   the second coil conductor pattern defines a first coil opening that generates a magnetic flux in the first direction and a second coil opening that generates a magnetic flux in a second direction opposite to the first direction when an electric current flows from one end of the second coil conductor pattern towards another end of the second coil conductor pattern;

the coil opening of the first coil conductor pattern, in a plan view, overlaps a plurality of coil openings including the first coil opening and the second coil opening of the second coil conductor pattern;

the first coil conductor pattern has a loop shape or a substantial loop shape;

the second coil conductor pattern includes an 8-shaped structure or a substantially 8-shaped structure on a single insulating layer of the plurality of insulating layers; and in a plan view, a total area of the first coil opening in which the coil opening of the first coil conductor pattern overlaps the first coil opening is different from a total area of the second coil opening in which the coil opening of the first coil conductor pattern overlaps the second coil opening.

2. The laminated coil component according to claim 1, wherein one of the first coil conductor pattern and the second coil conductor pattern defines a plurality of coils coupled to one another; and the plurality of coils are outer coil conductor patterns each provided in a position of holding another of the first coil conductor pattern and the second coil conductor pattern between the plurality of coils in a laminated direction.

3. A matching circuit comprising:

the laminated coil component according to claim 2;

a band pass filter including two LC parallel resonant circuits in which inductors are coupled to each other; and a transformer impedance conversion circuit configured by two inductors coupled to each other; wherein the inductors of the two LC parallel resonant circuits are defined by the outer coil conductor patterns; and the two inductors of the transformer impedance conversion circuit are defined by the coil conductor patterns held between the outer coil conductor patterns.

4. The matching circuit according to claim 3, wherein the transformer impedance conversion circuit is a T-type equivalent circuit.

5. The matching circuit according to claim 3, further comprising:

an input/output terminal and a ground terminal; wherein the two inductors of the transformer impedance conversion circuit are a first inductor including a first end and a second end, and a second inductor including a third end and a fourth end;

the first end of the first inductor and the third end of the second inductor are connected to each other;

a connection point at which the first end of the first inductor and the third end of the second inductor are connected is connected to the input/output terminal; and the fourth end of the second inductor is connected to the ground terminal.

6. The matching circuit according to claim 3, wherein the two LC parallel resonant circuits are coupled to each other by transformer coupling of the inductors.

7. The matching circuit according to claim 3, further comprising:

a plurality of the second coil conductor patterns; wherein the second coil conductor patterns are arranged so as to hold the first coil conductor pattern between the second coil conductor patterns in a laminated direction.

8. The matching circuit according to claim 3, wherein at least one of the first coil conductor pattern and the second coil conductor pattern is defined over a plurality of the insulating layers.

9. The matching circuit according to claim 3, wherein one of the first coil conductor pattern and the second coil conductor pattern defines a transformer configured by two coils coupled to each other; and another of the first coil conductor pattern and the second coil conductor pattern defines an inductor connected to a primary side or a secondary side of the transformer.

10. The matching circuit according to claim 3, wherein the second coil conductor pattern is point asymmetric.

11. The laminated coil component according to claim 1, wherein at least one of the first coil conductor pattern and the second coil conductor pattern is defined over a plurality of the insulating layers.

12. The laminated coil component according to claim 1, wherein one of the first coil conductor pattern and the second coil conductor pattern defines a transformer including two coils coupled to each other; and another of the first coil conductor pattern and the second coil conductor pattern defines an inductor connected to a primary side or a secondary side of the transformer.

13. The laminated coil component according to claim 1, wherein the second coil conductor pattern is point asymmetric.

* * * * *